Figure 1:
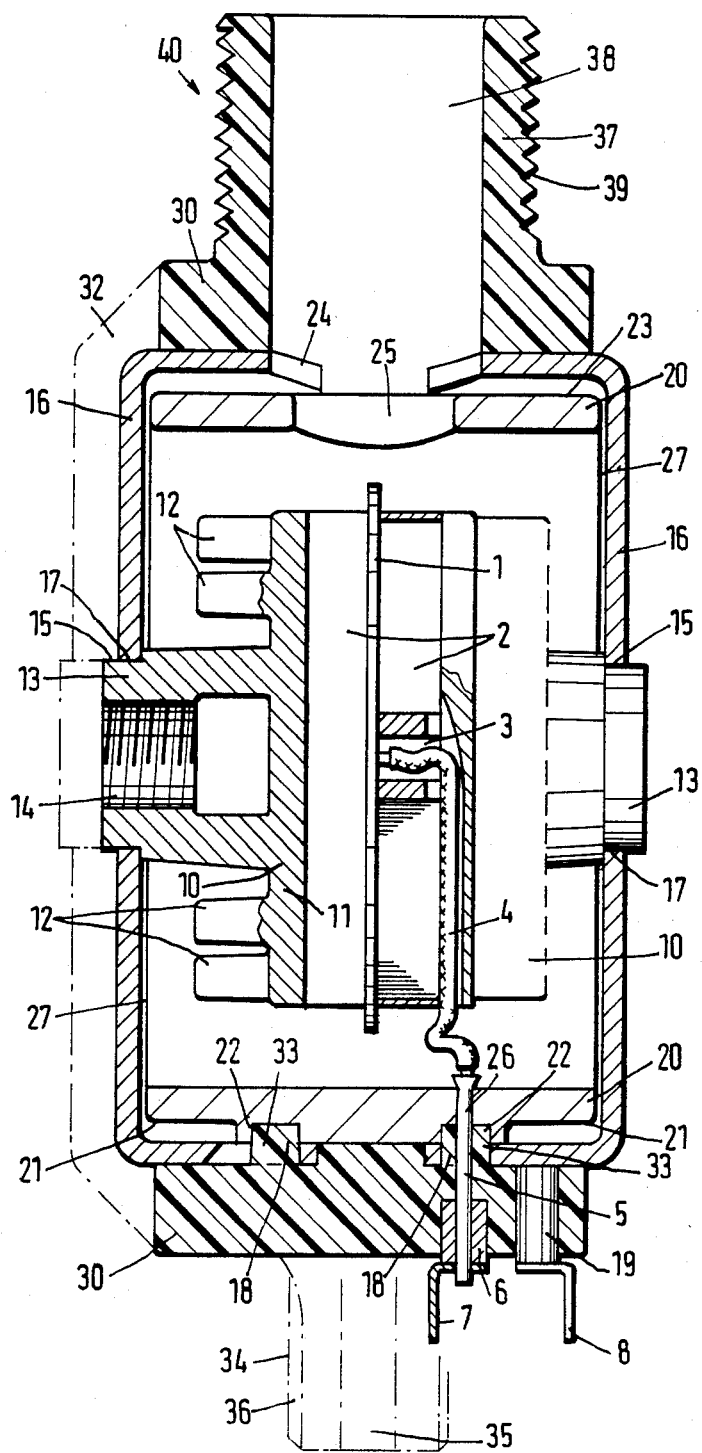

United States Patent [19]

Klein

[11] Patent Number: 4,520,383

[45] Date of Patent: May 28, 1985

[54] POWER SEMICONDUCTOR COMPONENT FOR BOILING COOLING

[75] Inventor: Erwin Klein, Heddesheim, Fed. Rep. of Germany

[73] Assignee: BBC Aktiengesellschaft Brown, Boveri & Cie., Baden, Switzerland

[21] Appl. No.: 419,831

[22] Filed: Sep. 17, 1982

[30] Foreign Application Priority Data

Sep. 19, 1981 [DE] Fed. Rep. of Germany ....... 3137407

[51] Int. Cl.³ ..................... H01L 23/34; H01L 23/46
[52] U.S. Cl. ......................................... 357/81; 357/82
[58] Field of Search ................. 357/82, 81; 165/80 C, 165/80 E

[56] References Cited

U.S. PATENT DOCUMENTS

| 3,746,947 | 7/1973 | Yamamoto et al. | 357/82 |
| 3,823,771 | 7/1974 | Ludwig | 357/82 X |
| 3,921,201 | 11/1975 | Eisele et al. | 165/80 C |
| 4,183,042 | 1/1980 | Novak et al. | 357/82 |

FOREIGN PATENT DOCUMENTS

| 2606156 | 8/1977 | Fed. Rep. of Germany | 357/82 |
| 2716066 | 10/1978 | Fed. Rep. of Germany | 357/82 |
| 851047 | 10/1960 | United Kingdom | 165/80 C |

*Primary Examiner*—Andrew J. James
*Assistant Examiner*—Sheila V. Clark
*Attorney, Agent, or Firm*—Herbert L. Lerner; Laurence A. Greenberg

[57] ABSTRACT

A power semiconductor component is used for boiling cooling of a power semiconductor crystal disc having two main electrodes, and optionally one or more control electrodes. Two multicontacts are provided, each being electrically connected to a respective one of the main electrodes for thermal and mechanical relief. Two heat sinks are provided, each being in electrical and thermal contact with a respective one of the multicontacts. Connecting eyes are integral with the heat sinks for electrically connecting the main electrodes. A liquid and gas-tight housing surrounds the semiconductor crystal disc, the housing including a ceramic sleeve having a boiling liquid space formed therein and metallic covers disposed laterally on the ceramic sleeve, the connecting eyes protrude through and are connected to the metallic covers, and an insulating sleeve is molded around the housing. The insulating sleeve has at least one stub formed thereon having a hole formed therein for conducting an electrically-insulating refrigerant flow through the housing directly contacting the semiconductor disc, the metallic covers have partially circular cutouts formed therein and the ceramic sleeve has a hole formed therein for the refrigerant flow.

9 Claims, 3 Drawing Figures

POWER SEMICONDUCTOR COMPONENT FOR BOILING COOLING

The invention relates to a power semiconductor component for boiling cooling of a semiconductor crystal disc which has two main electrodes and may have one or more control electrodes, the disc being built into a liquid and gas-tight housing through which an electrically-insulating refrigerant can flow, the two main electrodes of the semiconductor disc being electrically connected to multicontacts for the greatest possible thermal and mechanical relief, and the housing being formed substantially of a ceramic sleeve with metallic covers disposed on both sides, as well as refrigerant connections.

Such a power semiconductor component for boiling cooling is known from German Published Non-Prosecuted Application DE-OS 29 38 096. There, the multicontacts serve exclusively for carrying current and pierce the outer housing wall or make direct contact with the metallic inner housing wall. A heat sink arranged in the housing is not provided since the refrigerant is directly admitted to the semiconductor crystal disc. The multicontacts can be joined to the material or can be an electrical contact, for instance, as coil springs. Refrigerants such as liquids or gases can be used. The refrigerant must be insulating. The refrigerant can be oil or inert liquids with a boiling point as high as possible. If boiling cooling is utilized, i.e. the heat of evaporation when the state of the refrigerant changes from the liquid to the gaseous state, an advantageous cooling effect takes place. A detailed embodiment of a power semiconductor component specially for boiling cooling is not described, however.

From German Published Non-Prosecuted Application No. 28 55 493, a further power semiconductor component with multicontacts is known. There, the multicontacts consist of a brush-like bundle of individual wires, where at least part of the individual wires has a greater length than that which corresponds to the distance between the two disc surfaces. The multicontacts are connected as a material joint to the semiconductor crystal disc and to heat-removal discs. The housing of the power semiconductor component is formed by the heat removal discs, a ceramic sleeve as well as covering metal rings. A flow of the refrigerant through the housing itself is not provided.

From German Published Non-Prosecuted Application DE-OS 29 37 49 (sic), a similar power semiconductor component is known, in which the bundle forming the multicontacts consists of a metal ribbon wound-up to form a spiral, where the ribbon is provided at regular intervals with slots so that a multiplicity of resilient metal webs is produced which are connected on one side by a non-slotted piece of the metal ribbon. In this power semiconductor component as well, a refrigerant does not flow through the housing itself.

It is an object of the invention to describe in a power semiconductor component for boiling cooling of the type mentioned at the outset, a detailed design of an electrically and refrigerant-wise ready-to-connect element, where a disc cell design without force-locking contact is to be present.

This problem is solved by providing a power semiconductor component for boiling cooling of a power semiconductor crystal disc having two main electrodes, comprising two multicontacts each being electrically connected to a respective one of the main electrodes for thermal and mechanical relief, two heat sinks each being in electrical and thermal contact with a respective one of the multicontacts, connecting eyes integral with the heat sinks for electrically connecting the main electrodes, a liquid and gas-tight housing surrounding the semiconductor crystal disc, the housing including a ceramic sleeve having a boiling liquid space formed therein and metallic covers disposed laterally on the ceramic sleeve, the connecting eyes protruding through and connected to the metallic covers, and an insulating sleeve molded around the housing, the insulating sleeve having at least one stub formed thereon having a hole formed therein for conducting an electrically-insulating refrigerant flow through the housing directly contacting the semiconductor disc, the metallic covers having partially circular cutouts formed therein and the ceramic sleeve having a hole formed therein for the refrigerant flow.

The advantages attainable with the invention are in particular that the power semiconductor component need not make contact by contact pressure (which is important in the case of large semiconductor crystal disc diameters), but can nevertheless be cooled very well. It is suitable particularly as an individual building block of an assembly consisting of many similar power semiconductor components, where the accessibility of the invidual components is very good (which is important for replacing defective building blocks) and flexibility with respect to insulation and mounting is provided.

Because of the component design of the component, the amount of refrigerant can be small, which results in corresponding weight and cost savings.

Advantageous embodiments of the invention are characterized in the subclaims.

Figure 2:
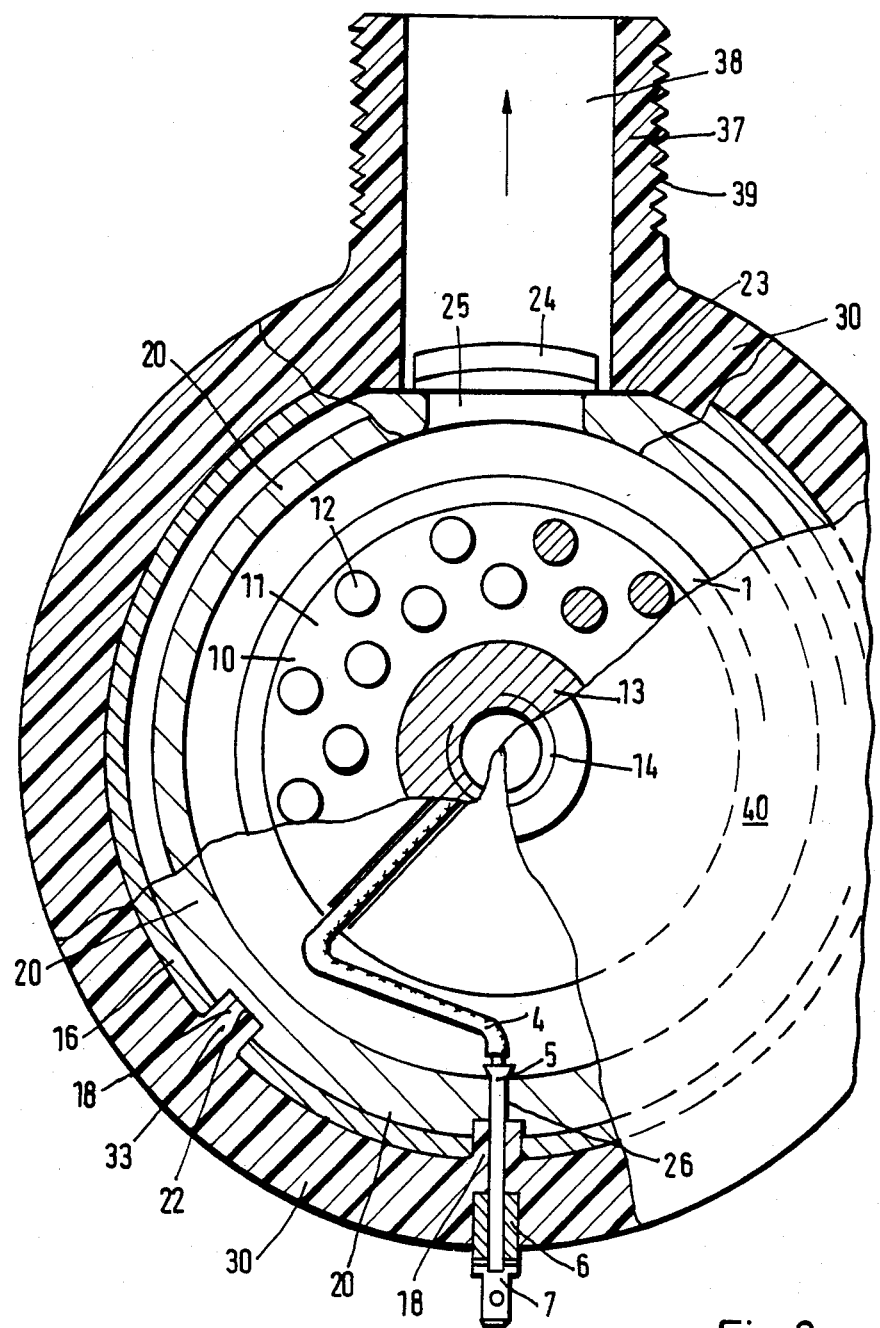
Figure 3:
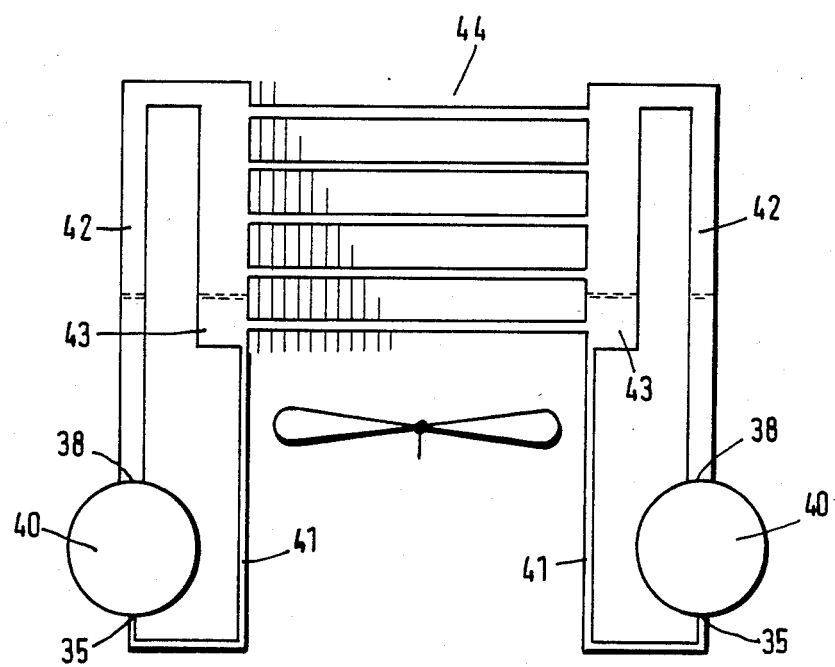

The invention will be explained in the following with the aid of the embodiment example shown in the drawings, where FIG. 1 shows the power semiconductor component for boiling cooling in a cross-sectional side view, FIG. 2 shows the power semiconductor component in a partly cross-sectional top view, and FIG. 3 shows an overall arrangement of power semiconductor components with a closed-circuit cooling device.

In FIG. 1, the power semiconductor component for boiling cooling is shown in a cross-sectional side view. A semiconductor crystal disc 1 contained in the interior of the power semiconductor component is connected via multicontacts 2 (multi-spring contacts) on both sides by means of substance joints (soldering) to heat sinks 10. Each of the two heat sinks 10 consists of a bottom 11 which carries cooling rods 12 for increasing the surface. For the electrical connection of the semiconductor component, a connecting eye 13 with an internal thread 14 is formed at each heat sink 10 centrically, the connecting eye 13 being provided with a lathe cut 15 on the outside. To each of these lathe cuts 15, a cup-shaped metallic cover 16 is fastened in a material-joining manner via its central hole 17.

Before the individual parts namely, the semiconductor crystal disc 1, multicontact 2, heat sink 10 and cover 16 of the power semiconductor component are assembled together, a ceramic sleeve 20 is inserted between the two covers 16. This sleeve 20 is provided on both sides with external lathe cuts 21 (shoulders) several smaller blind holes 22, a flat 23 and two larger holes 25 (only one hole 25 is shown).

An insulating sleeve 30 (of insulating compound) is molded around the assembled unit. The ceramic sleeve 20 serves here as a broken mold. This insulating sleeve 30 which, if necessary, can be enlarged by insulating covers 32 (of insulating material) attached on both sides provides the necessary external electrical insulation of the power semiconductor component. In addition, the insulating sleeve 30 establishes the mechanical connection between the metallic covers 16, so that tension relief of the material-joining connections is provided. To this end, the metallic covers 16 are provided with holes 18 and the ceramic sleeves 20 with blind holes 22, in which the insulating compound of the insulating sleeve is anchored with bumps 33 during the molding process. A stub 34 with a central hole 35 (for feeding-in the refrigerant) and a thread 36 as well as, a stub 37 diametrically opposite the stub 34 with a hole 38 (for discharging the refrigerant) and an external thread 39 are formed on the insulating sleeve 30. As mentioned above, these stubs 34, 37 serve for feeding-in and discharging liquid or gaseous refrigerant, the direction of the arrow shown indicating the direction of the refrigerant path. In order to permit the gaseous refrigerant to pass into the hole 38 unimpeded, the metallic covers 16 are provided with partially circular cutouts 24.

If the power semiconductor component of the design type described is designed as a thyristor, then a gate terminal line 4 is brought through a hole 3 of the multicontact 2 for making contact with the semiconductor crystal disc 1. The gate is connected to the outside by means of a contact pin 5 which is secured in a hole 26 of the ceramic sleeve 20. The contact pin 5 is anchored in the insulating sleeve 30 by means of a jack 6. At the outer end of the contact pin 5, a flat plug 7 is fastened. An auxiliary cathode terminal of the thyristor is provided via a metallic bolt 19 which is welded to the metallic cover 16 of the semiconductor component on the cathode side and carries an external flat plug 8.

With a corresponding spatial relationship of the power semiconductor component and the closed-circuit cooling device and with sufficiently large design of the gas line as well as of the hole 38 for the refrigerant discharge, the refrigerant can be returned via the gas line itself by gravity; in this special case, only one stub 37 with a hole 38 for feeding-in and discharging the refrigerant is therefore required. The liquid refrigerant then mainly makes contact with the wall of the hole 38. When the liquid drops from the hole 38, it hits the flat 23 of the ceramic sleeve 20, then continues on the lathe cuts 21 and passes through the gaps 27 existing between the covers 16 and the ceramic sleeve 20 into the evaporation space in the interior of the ceramic sleeve 20. The entire power semiconductor component for boiling cooling shown in FIG. 1 is designated with the reference symbol 40. In FIG. 2, the power semiconductor component 40 is shown in a partially cross-sectional top view. In detail, FIG. 2 shows the radial design of the component with a central semiconductor crystal 1, heat sinks 10 placed thereon (with bottom 11 and cooling rods 12), with a ceramic sleeve 20 following thereon toward the outside, metallic cover 16 and insulating sleeve 30.

Also seen is the anchoring between the ceramic sleeve 20 and the insulating sleeve 30 by means of the bumps 33 which are engaged through the holes 18 of the metallic covers 16 with the blind holes 22 of the ceramic sleeve 20. Furthermore, the gate connection via the contact pin 5 is anchored in the insulating sleeve 30 by means of the jack 6 and is brought through a hole 18 in the metallic cover 16 and the hole 26 through the ceramic sleeve 20. The contact pin 5 is connected externally to the flat plug 7 and internally to the gate connecting line 4.

FIG. 2 also shows the connecting eye 13 with internal thread 14 for the electrical connection of the power semiconductor component as well as the refrigerant discharge via the stub 37 with external thread 39 of the insulating sleeve 30. The refrigerant discharge (see arrow direction) takes place via the hole 25 in the ceramic sleeve 20 at the point of the flat 23, and further via the partially circular cutout 24 of the metallic covers 16 through the hole 38 of the stub 37.

In FIG. 3, an overall arrangement of two power semiconductor components 40 with a closed-circuit cooling device are shown. At a hole 35, the lower part of each of the two power semiconductor components 40 (as many further such elements as desired may be provided) has a coolant feedline 41 for feeding-in the liquid refrigerant, and in the upper part, at the hole 38, a refrigerant discharge line 42 for discharging the gaseous refrigerant which is heated up by the dissipation heat produced in the semiconductor crystal disc 1. The refrigerant inlet lines 41 in this case are smaller than the refrigerant discharge lines 42. For cooling the refrigerant 43, a heat exchanger 44 is provided. The cooler 44 consists substantially of tubes with fins, the cooling air of a blower being blown against the tubes. The cooler 44 gives off the heat produced in the components 40 to the environment via condensation. The closed circuit cooler 44 must be arranged physically higher than the individual power semiconductor components 40 to ensure an unimpeded flow of the liquid refrigerant 43 to the components 40 without an additional pump.

A suitable refrigerant with excellent properties is refrigerant type 113 ($C_2F_3Cl_3$) with a boiling point of 47.6° C. at normal pressure. It has a high dielectric strength of about 15 kV/mm in the liquid as well as in the gaseous state, is non-flammable and non-toxic. The heat transfer coefficient, a characteristic for a type of cooling, is excellent and is approximately that of flowing water. However, so-called inert liquids which have the advantage of practically absolute material compatibility, can also be used as refrigerants; however, they are very expensive.

I claim:

1. Power semiconductor component for boiling cooling of a power semiconductor crystal disc having two main electrodes, comprising two multicontacts each being electrically connected to a respective one of the main electrodes for thermal and mechanical relief, two heat sinks each being in electrical and thermal contact with a respective one of said multicontacts, connecting eyes integral with said heat sinks for electrically connecting said main electrodes, a liquid and gas-tight housing surrounding the semiconductor crystal disc, said housing including a ceramic sleeve having a boiling liquid space formed therein and metallic covers disposed laterally on said ceramic sleeve, said connecting eyes protruding through and connected to said metallic covers, and an insulating sleeve molded around said housing, said insulating sleeve having at least one stub formed thereon having a hole formed therein for conducting an electrically-insulating refrigerant flow through said housing directly contacting the semiconductor disc, said metallic covers having partially circular cutouts formed therein and said ceramic sleeve having a hole formed therein for said refrigerant flow.

2. Power semiconductor component according to claim 1, wherein a gap (27) for the refrigerant input is formed between the ceramic sleeve (20) and the metallic covers (16).

3. Power semiconductor component according to claim 1, wherein said at least one stub is in the form of two stubs (34, 37) each having a hole formed therein (35, 38) for the separate refrigerant input and output, said metallic covers (16) having another partially circular cutout (34) formed therein, and the ceramic sleeve (20) having another hole (25) formed therein, one of said cutouts and one of said holes in said sleeve being in communication with one of said holes in said stubs, and the other of said cutouts and said holes in said sleeve being in communication with the other of said holes in said stubs.

4. Power semiconductor component according to claim 1, wherein said ceramic sleeve (20) has a flat (23) formed thereon in vicinity of said stub.

5. Power semiconductor component according to claim 1, including bumps (33) provided on the inside of the insulating sleeve (30), which engage through holes (18) in the metallic covers (16) in blind holes (22) of the ceramic sleeve (20).

6. Power semiconductor component according to claim 1, wherein said metallic covers (16) have holes (17) which can be slipped on lathe cuts (15) of the connection eyes (13).

7. Power semiconductor component according to claim 1, wherein said heat sinks (10) have a bottom (11) and cooling rods (12) formed at the bottom.

8. Power semiconductor component according to claim 1, wherein said insulating sleeve (30) is provided on both sides with insulating covers (32).

9. Power semiconductor component according to claim 1, wherein the semiconductor crystal disc has a control electrode, and including a control connection for the semiconductor crystal disc (1) in the form of a hole (3) in the multicontact (2) and an internal gate connection line (4), which is connected on the other side to a contact pin (5) which goes through the housing via a hole (26) in the ceramic sleeve (20), a hole (18) in the metallic cover (16), and a jack (6) in the insulating sleeve (30).

* * * * *